(12) United States Patent
Lee et al.

(10) Patent No.: US 12,525,552 B2
(45) Date of Patent: Jan. 13, 2026

(54) RADIO FREQUENCY CHIP PACKAGE

(71) Applicant: WAVEPIA CO., LTD., Gyeonggi-do (KR)

(72) Inventors: Sang-Hun Lee, Gyeonggi-do (KR); Sang-Yeol Lee, Gyeonggi-do (KR); Sang-Soo Kim, Gyeonggi-do (KR)

(73) Assignee: WAVEPIA CO., LTD., Gyeonggi-do (KR)

(*) Notice: Subject to any disclaimer, the term of this patent is extended or adjusted under 35 U.S.C. 154(b) by 864 days.

(21) Appl. No.: 17/696,171

(22) Filed: Mar. 16, 2022

(65) Prior Publication Data
US 2023/0154874 A1 May 18, 2023

(30) Foreign Application Priority Data

Nov. 4, 2021 (KR) .......... 10-2021-0150628

(51) Int. Cl.
*H01L 23/66* (2006.01)
*H01L 23/00* (2006.01)
*H01L 25/065* (2023.01)

(52) U.S. Cl.
CPC .............. *H01L 23/66* (2013.01); *H01L 24/48* (2013.01); *H01L 25/0655* (2013.01); *H01L 2223/6611* (2013.01); *H01L 2223/6672* (2013.01); *H01L 2224/48138* (2013.01); *H01L 2924/1421* (2013.01); *H01L 2924/1515* (2013.01); *H01L 2924/15153* (2013.01)

(58) Field of Classification Search
CPC ..... H01L 23/66; H01L 24/48; H01L 25/0655; H01L 2223/6611; H01L 2223/6672; H01L 2224/48138; H01L 2924/1421; H01L 2924/1515; H01L 2924/15153; H01L 2223/6644; H01L 2223/6655; H01L 24/49; H01L 23/645; H01L 25/16; H01L 2224/49096; H10D 1/20
See application file for complete search history.

(56) References Cited

U.S. PATENT DOCUMENTS

2010/0046184 A1* 2/2010 Yasooka ............... H01L 23/043
361/767

FOREIGN PATENT DOCUMENTS

KR 101191075 10/2012

* cited by examiner

*Primary Examiner* — Cuong B Nguyen
(74) *Attorney, Agent, or Firm* — IPLA P.A.

(57) ABSTRACT

A radio frequency (RF) chip package includes: an RF die; a first peripheral circuit chip; a second peripheral circuit chip; a substrate having a ⊓-shaped step formed on a portion thereof so that the RF die is mounted on top of the step of the substrate and the first peripheral circuit chip and the second peripheral circuit chip are mounted on top of the substrate where no step is formed; a first mutual inductance controller for controlling the dimension of the mutual inductance between the first peripheral circuit chip and the RF die; and a second mutual inductance controller for controlling the dimension of the mutual inductance between the second peripheral circuit chip and the RF die.

12 Claims, 3 Drawing Sheets

RADIO FREQUENCY CHIP PACKAGE

CROSS REFERENCE

The present application claims the benefit of Korean Patent Application No. 10-2021-0150628 filed in the Korean Intellectual Property Office on Nov. 4, 2021, the entire contents of which are incorporated herein by reference.

BACKGROUND

The present invention relates to a radio frequency (RF) chip package, and more specifically, an RF chip package that is capable of being configured to mount mutual inductance controllers thereon to control the mutual inductances generated between peripheral circuit chips and an RF die, so that adverse reactions can be effectively suppressed from occurring due to the parasitic inductances present among the peripheral circuit chips, bonding wires, and the RF die.

As information and communication technologies (ICT) are spread, various activities done outdoors are carried out inside a space. Accordingly, an indoor space occupation percentage in a daily life is gradually increased, and besides, services for outdoor spaces such as navigation services are increasingly spreading for the purpose of indoor spaces.

To satisfy demands for such services, high-performance RF products have been suggested.

So as to provide the high performance, it is necessary that a peripheral circuit chip having matching circuits or passive elements is electrically connected to an RF die by means of wire bonding within one package.

As a level of integration of the RF die is drastically increased, further, the frequency characteristics of the RF product may be reduced due to the parasitic inductances present among the peripheral circuit chip having matching circuits or passive elements, bonding wires, and the RF die.

A conventional technology related to the present invention is disclosed in Korean Patent No. 10-1191075.

SUMMARY OF THE INVENTION

Accordingly, the present invention has been made in view of the above-mentioned problems occurring in the related art, and it is an object of the present invention to provide an RF chip package that is capable of being configured to mount mutual inductance controllers thereon to control the mutual inductances generated between peripheral circuit chips and an RF die, so that adverse reactions can be effectively suppressed from occurring due to the parasitic inductances present among the peripheral circuit chips, bonding wires, and the RF die.

To accomplish the above-mentioned objects, according to a first aspect of the present invention, there is provided an RF chip package including: an RF die; a first peripheral circuit chip electrically connected to pads of the RF die by means of wire bonding, having matching circuits or passive elements, and located on the left side of the RF die; a second peripheral circuit chip electrically connected to pads of the RF die by means of wire bonding, having matching circuits or passive elements, and located on the right side of the RF die; a substrate for mounting the RF die, the first peripheral circuit chip, and the second peripheral circuit chip thereon and having a ⊓-shaped step formed on a portion thereof so that the RF die is mounted on top of the step of the substrate and the first peripheral circuit chip and the second peripheral circuit chip are mounted on top of the substrate where no step is formed; a first mutual inductance controller spaced apart from the first peripheral circuit chip and the RF die, respectively, on top of the substrate between the first peripheral circuit chip and the RF die to thus control the dimension of the mutual inductance between the first peripheral circuit chip and the RF die; and a second mutual inductance controller spaced apart from the second peripheral circuit chip and the RF die, respectively, on top of the substrate between the second peripheral circuit chip and the RF die to thus control the dimension of the mutual inductance between the second peripheral circuit chip and the RF die.

According to the present invention, desirably, the first mutual inductance controller or the second mutual inductance controller is constituted of a conductor bar having the shape of a rectangular parallelepiped and made of any one material selected from Cu, Al, Au, and Ag.

According to the present invention, desirably, the first mutual inductance controller or the second mutual inductance controller is configured to allow the dimension of the conductor bar to be adjusted to control the dimension of the mutual inductance between the first peripheral circuit chip and the RF die or between the second peripheral circuit chip and the RF die.

According to the present invention, desirably, the first mutual inductance controller or the second mutual inductance controller is configured to have a plurality of conductor bars with the same size as one another stacked on one another to thus control the dimension of the mutual inductance between the first peripheral circuit chip and the RF die or between the second peripheral circuit chip and the RF die.

To accomplish the above-mentioned objects, according to a second aspect of the present invention, there is provided a radio frequency (RF) chip package including: an RF die; a first peripheral circuit chip electrically connected to pads of the RF die by means of wire bonding, having matching circuits or passive elements, and located on the left side of the RF die; a second peripheral circuit chip electrically connected to pads of the RF die by means of wire bonding, having matching circuits or passive elements, and located on the right side of the RF die; a substrate for mounting the RF die, the first peripheral circuit chip, and the second peripheral circuit chip thereon and having a ⊓-shaped step formed on a portion thereof so that the RF die is mounted on top of the step of the substrate and the first peripheral circuit chip and the second peripheral circuit chip are mounted on top of the substrate where no step is formed; and a first mutual inductance controller spaced apart from the first peripheral circuit chip and the RF die, respectively, on top of the substrate between the first peripheral circuit chip and the RF die, to thus control the dimension of the mutual inductance between the first peripheral circuit chip and the RF die.

According to the present invention, desirably, the first mutual inductance controller is constituted of a conductor bar having the shape of a rectangular parallelepiped and made of any one material selected from Cu, Al, Au, and Ag.

According to the present invention, desirably, the first mutual inductance controller is configured to allow the dimension of the conductor bar to be adjusted to control the dimension of the mutual inductance between the first peripheral circuit chip and the RF die.

According to the present invention, desirably, the first mutual inductance controller is configured to have a plurality of conductor bars with the same size as one another stacked on one another to thus control the dimension of the mutual inductance between the first peripheral circuit chip and the RF die.

To accomplish the above-mentioned objects, according to a third aspect of the present invention, there is provided a radio frequency (RF) chip package including: an RF die; a first peripheral circuit chip electrically connected to pads of the RF die by means of wire bonding, having matching circuits or passive elements, and located on the left side of the RF die; a second peripheral circuit chip electrically connected to pads of the RF die by means of wire bonding, having matching circuits or passive elements, and located on the right side of the RF die; a substrate for mounting the RF die, the first peripheral circuit chip, and the second peripheral circuit chip thereon and having a ⊐⌐ -shaped step formed on a portion thereof so that the RF die is mounted on top of the step of the substrate and the first peripheral circuit chip and the second peripheral circuit chip are mounted on top of the substrate where no step is formed; and a second mutual inductance controller spaced apart from the second peripheral circuit chip and the RF die, respectively, on top of the substrate between the second peripheral circuit chip and the RF die, to thus control the dimension of the mutual inductance between the second peripheral circuit chip and the RF die.

According to the present invention, desirably, the second mutual inductance controller is constituted of a conductor bar having the shape of a rectangular parallelepiped and made of any one material selected from Cu, Al, Au, and Ag.

According to the present invention, desirably, the second mutual inductance controller is configured to allow the dimension of the conductor bar to be adjusted to control the dimension of the mutual inductance between the second peripheral circuit chip and the RF die.

According to the present invention, desirably, the second mutual inductance controller is configured to have a plurality of conductor bars with the same size as one another stacked on one another to thus control the dimension of the mutual inductance between the second peripheral circuit chip and the RF die.

To accomplish the above-mentioned objects, according to a fourth aspect of the present invention, there is provided a radio frequency (RF) chip package including: an RF die; a first peripheral circuit chip electrically connected to pads of the RF die by means of wire bonding, having matching circuits or passive elements, and located on the left side of the RF die; a second peripheral circuit chip electrically connected to pads of the RF die by means of wire bonding, having matching circuits or passive elements, and located on the right side of the RF die; a substrate for mounting the RF die, the first peripheral circuit chip, and the second peripheral circuit chip thereon and having a ⌐⊐ -shaped cavity formed on a portion thereof so that the RF die is mounted on top of the cavity of the substrate and the first peripheral circuit chip and the second peripheral circuit chip are mounted on top of the substrate where no cavity is formed; a first mutual inductance controller spaced apart from the first peripheral circuit chip and the RF die, respectively, on top of the substrate between the first peripheral circuit chip and the RF die, to thus control the dimension of the mutual inductance between the first peripheral circuit chip and the RF die; and a second mutual inductance controller spaced apart from the second peripheral circuit chip and the RF die, respectively, on top of the substrate between the second peripheral circuit chip and the RF die, to thus control the dimension of the mutual inductance between the second peripheral circuit chip and the RF die.

According to the present invention, desirably, the first mutual inductance controller or the second mutual inductance controller is constituted of a conductor bar having the shape of a rectangular parallelepiped and made of any one material selected from Cu, Al, Au, and Ag.

According to the present invention, desirably, the first mutual inductance controller or the second mutual inductance controller is configured to allow the dimension of the conductor bar to be adjusted to control the dimension of the mutual inductance between the first peripheral circuit chip and the RF die or between the second peripheral circuit chip and the RF die.

According to the present invention, desirably, the first mutual inductance controller or the second mutual inductance controller is configured to have a plurality of conductor bars with the same size as one another stacked on one another to thus control the dimension of the mutual inductance between the first peripheral circuit chip and the RF die or between the second peripheral circuit chip and the RF die.

To accomplish the above-mentioned objects, according to a fifth aspect of the present invention, there is provided a radio frequency (RF) chip package including: an RF die; a first peripheral circuit chip electrically connected to pads of the RF die by means of wire bonding, having matching circuits or passive elements, and located on the left side of the RF die; a second peripheral circuit chip electrically connected to pads of the RF die by means of wire bonding, having matching circuits or passive elements, and located on the right side of the RF die; a substrate for mounting the RF die, the first peripheral circuit chip, and the second peripheral circuit chip thereon and having a ⌐⊐ -shaped cavity formed on a portion thereof so that the RF die is mounted on top of the cavity of the substrate and the first peripheral circuit chip and the second peripheral circuit chip are mounted on top of the substrate where no cavity is formed; and a first mutual inductance controller spaced apart from the first peripheral circuit chip and the RF die, respectively, on top of the substrate between the first peripheral circuit chip and the RF die, to thus control the dimension of the mutual inductance between the first peripheral circuit chip and the RF die.

According to the present invention, desirably, the first mutual inductance controller is constituted of a conductor bar having the shape of a rectangular parallelepiped and made of any one material selected from Cu, Al, Au, and Ag.

According to the present invention, desirably, the first mutual inductance controller is configured to allow the dimension of the conductor bar to be adjusted to control the dimension of the mutual inductance between the first peripheral circuit chip and the RF die.

According to the present invention, desirably, the first mutual inductance controller is configured to have a plurality of conductor bars with the same size as one another stacked on one another to thus control the dimension of the mutual inductance between the first peripheral circuit chip and the RF die.

To accomplish the above-mentioned objects, according to a sixth aspect of the present invention, there is provided a radio frequency (RF) chip package including: an RF die; a first peripheral circuit chip electrically connected to pads of the RF die by means of wire bonding, having matching circuits or passive elements, and located on the left side of the RF die; a second peripheral circuit chip electrically connected to pads of the RF die by means of wire bonding, having matching circuits or passive elements, and located on the right side of the RF die; a substrate for mounting the RF die, the first peripheral circuit chip, and the second peripheral circuit chip thereon and having a ⎯⎿⎽⎿⎯ -shaped cavity formed on a portion thereof so that the RF die is mounted on top of the cavity of the substrate and the first peripheral circuit chip and the second peripheral circuit chip are mounted on top of the substrate where no cavity is formed; and a second mutual inductance controller spaced apart from the second peripheral circuit chip and the RF die, respectively, on top of the substrate between the second peripheral circuit chip and the RF die, to thus control the dimension of the mutual inductance between the second peripheral circuit chip and the RF die.

According to the present invention, desirably, the second mutual inductance controller is constituted of a conductor bar having the shape of a rectangular parallelepiped and made of any one material selected from Cu, Al, Au, and Ag.

According to the present invention, desirably, the second mutual inductance controller is configured to allow the dimension of the conductor bar to be adjusted to control the dimension of the mutual inductance between the second peripheral circuit chip and the RF die.

According to the present invention, desirably, the second mutual inductance controller is configured to have a plurality of conductor bars with the same size as one another stacked on one another to thus control the dimension of the mutual inductance between the second peripheral circuit chip and the RF die.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENTS

Figure 1:
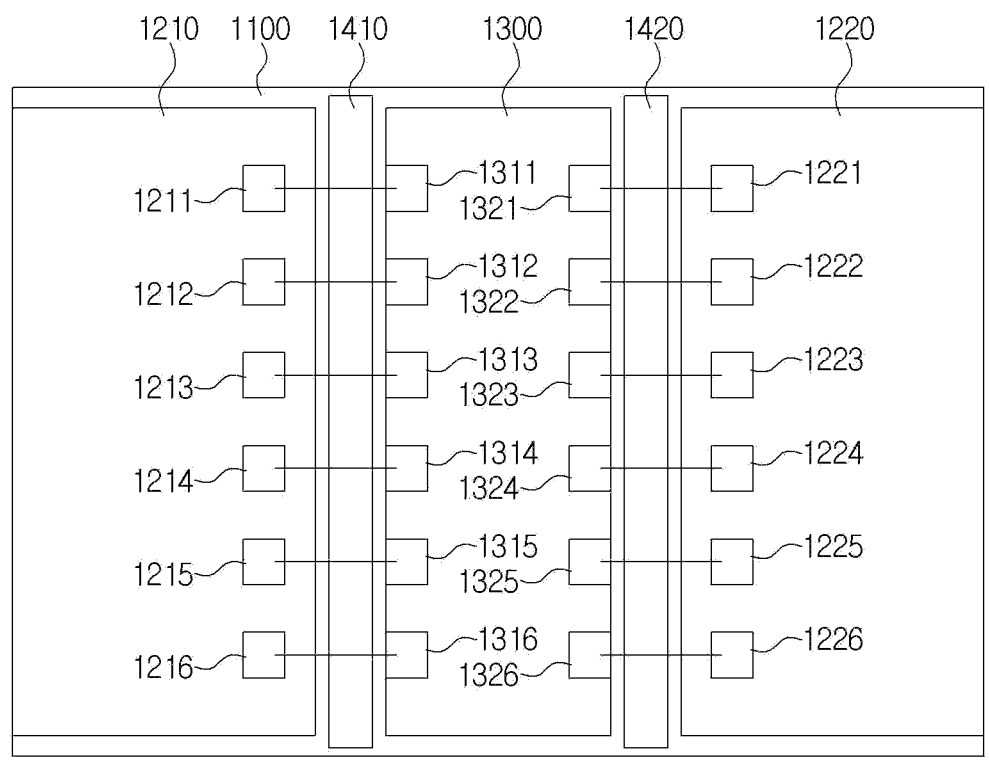
FIG. 1 is a plan view showing an RF chip package according to a first embodiment of the present invention.

Hereinafter, an explanation on an RF chip package according to the present invention will be given with reference to the attached drawings.

Embodiments of the present invention as will be discussed later will be in detail described so that they may be carried out easily by those having ordinary skill in the art, and therefore, these do not limit the idea and technical scope of the invention. Before the present invention is disclosed and described, it is to be understood that the disclosed embodiments are merely exemplary of the invention, which can be embodied in various forms. Further, it should be understood that the positions or arrangements of individual components in the disclosed embodiments of the present invention may be changed within the spirit and scope of the present invention.

Therefore, specific structural and functional details disclosed herein are not to be interpreted as limiting, but merely as a basis for the claims and as a representative basis for teaching one of ordinary skill in the art to variously employ the present invention in virtually any appropriately detailed structure. The similar parts in the drawings of the present invention have the same functions as one another or similar functions to one another in terms of various views, and their lengths, areas, and thicknesses may be magnified for the clarity and convenience of the description.

Figure 2:
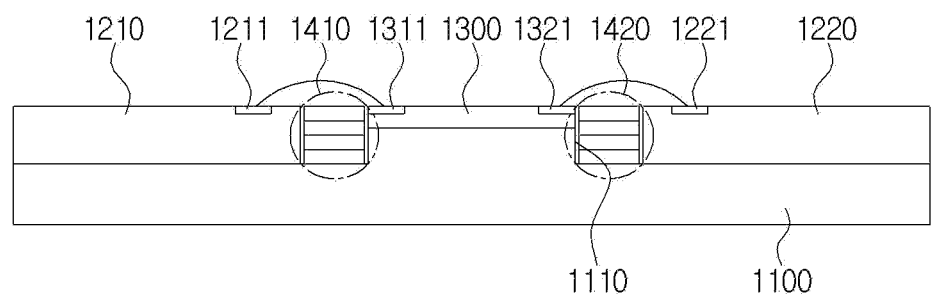
FIG. 2 is a sectional view showing the RF chip package according to the first embodiment of the present invention.
Figure 3:
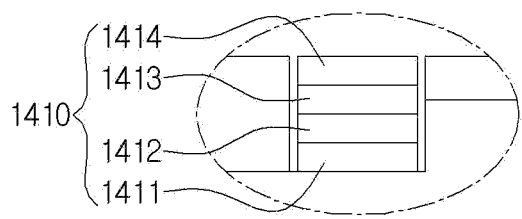
FIG. 3 is an enlarged sectional view showing a first mutual inductance controller of FIG. 2.
Figure 4:
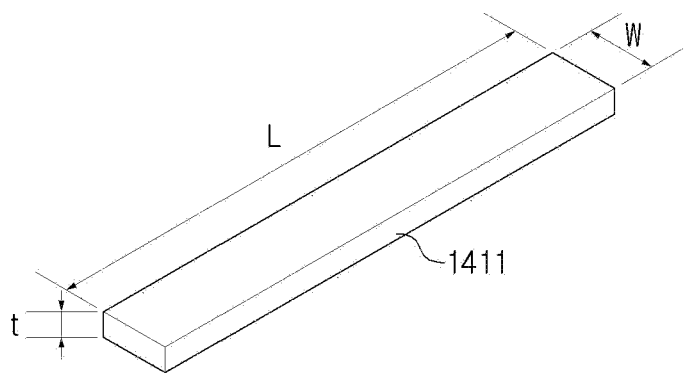
FIG. 4 is a perspective view showing a conductor bar constituting the first mutual inductance controller of FIG. 3.
Figure 5:
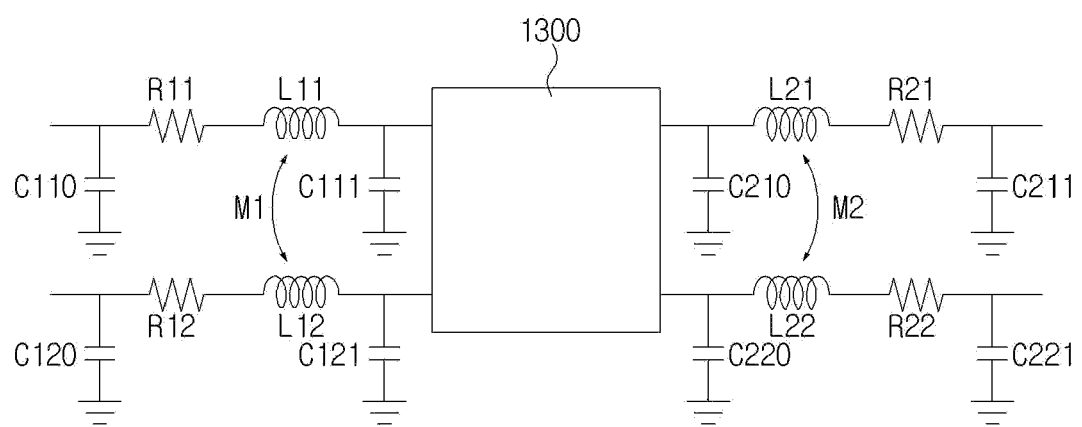
FIG. 5 is an equivalent circuit diagram showing models of parasitic inductances and mutual inductances generated among peripheral circuit chips, bonding wires, and an RF die of the RF chip package of FIG. 1.

FIG. 1 is a plan view showing an RF chip package according to a first embodiment of the present invention, FIG. 2 is a sectional view showing the RF chip package according to the first embodiment of the present invention, FIG. 3 is an enlarged sectional view showing a first mutual inductance controller of FIG. 2, FIG. 4 is a perspective view showing a conductor bar constituting the first mutual inductance controller of FIG. 3, and FIG. 5 is an equivalent circuit diagram showing models of parasitic inductances and mutual inductances generated among peripheral circuit chips, bonding wires, and an RF die of the RF chip package of FIG. 1.

Now, an explanation of an RF chip package according to a first embodiment of the present invention will be given with reference to FIGS. 1 to 5. As shown in FIG. 1, the RF chip package according to the first embodiment of the present invention includes an RF die 1300, a first peripheral circuit chip 1210 electrically connected to pads 1311 to 1316 of the RF die 1300 by means of wire bonding, having matching circuits or passive elements, and located on the left side of the RF die 1300, a second peripheral circuit chip 1220 electrically connected to pads 1321 to 1326 of the RF die 1300 by means of wire bonding, having matching circuits or passive elements, and located on the right side of the RF die 1300, and a substrate 1100 for mounting the RF die 1300, the first peripheral circuit chip 1210, and the second peripheral circuit chip 1220 thereon.

In this case, the substrate 1100 is constituted of a silicon substrate or copper substrate, and as shown in FIG. 2, a portion of the substrate 1100 is provided with a ⎯⎿⎽⎿⎯ -shaped step 1110 by means of etching or grinding.

Accordingly, the RF die 1300 is mounted on top of the step 1110 of the substrate 1100, and the first peripheral circuit chip 1210 and the second peripheral circuit chip 1220 are mounted on top of the substrate 1100 where the step 1110 is not formed. In this case, the pads 1211 to 1216 of the first peripheral circuit chip 1210 and the pads 1221 to 1226 of the second peripheral circuit chip 1220 are electrically connected to pads 1311 to 1316 and 1321 to 1326 of the RF die 1300 by means of the wire bonding.

As shown in FIGS. 2 and 3, further, a first mutual inductance controller 1410 is spaced apart from the first peripheral circuit chip 1210 and the RF die 1300, respectively, on top of the substrate 1100 between the first peripheral circuit chip 1210 and the RF die 1300 to thus control the dimension of the mutual inductance between the first peripheral circuit chip 1210 and the RF die 1300.

As shown in FIGS. 2 and 3, further, a second mutual inductance controller 1420 is spaced apart from the second peripheral circuit chip 1220 and the RF die 1300, respectively, on top of the substrate 1100 between the second peripheral circuit chip 1220 and the RF die 1300 to thus control the dimension of the mutual inductance between the second peripheral circuit chip 1220 and the RF die 1300.

In this case, R11 and R12 as shown in FIG. 5 are models of parasitic resistances present among the first peripheral circuit chip 1210, the bonding wires, and the RF die 300, and L11 and L12 as shown in FIG. 5 are models of parasitic inductances present among the first peripheral circuit chip 1210, the bonding wires, and the RF die 300. Further, C110, C111, C120 and C121 as shown in FIG. 5 are models of parasitic capacitances present among the first peripheral circuit chip 1210, the bonding wires, and the RF die 300, and M1 as shown in FIG. 5 is a model of a mutual inductance produced among the first peripheral circuit chip 1210, the bonding wires, and the RF die 300, which is induced by means of the first mutual inductance controller 1410.

Further, R21 and R22 as shown in FIG. 5 are models of parasitic resistances present among the second peripheral circuit chip 1220, the bonding wires, and the RF die 300, and L21 and L22 as shown in FIG. 5 are models of parasitic inductances present among the second peripheral circuit chip 1220, the bonding wires, and the RF die 300. Further, C210, C211, C220 and C221 as shown in FIG. 5 are models of parasitic capacitances present among the second peripheral circuit chip 1220, the bonding wires, and the RF die 300, and M2 as shown in FIG. 5 is a model of a mutual inductance produced among the second peripheral circuit chip 1220, the bonding wires, and the RF die 300, which is induced by means of the second mutual inductance controller 1420.

Further, as shown in FIG. 4, the first mutual inductance controller 1410 or the second mutual inductance controller 1420 is constituted of a conductor bar 1411 having the shape of a rectangular parallelepiped and made of any one material selected from Cu, Al, Au, and Ag.

In this case, the first mutual inductance controller 1410 or the second mutual inductance controller 1420 is configured to allow the dimension of the conductor bar 1411 to be adjusted to thus control the dimension of the mutual inductance between the first peripheral circuit chip 1210 and the RF die 1300 or between the second peripheral circuit chip 1220 and the RF die 1300.

In detail, as shown in FIG. 4, any one of sizes t, W, and L of the conductor bar 1411 is changed so that the dimension of the conductor bar 1411 can be adjusted.

Further, as shown in FIG. 3, the first mutual inductance controller 1410 or the second mutual inductance controller 1420 is configured to have a plurality of conductor bars 1411 to 1414 with the same size as one another stacked on one another to thus control the dimension of the mutual inductance between the first peripheral circuit chip 1210 and the RF die 1300 or between the second peripheral circuit chip 1220 and the RF die 1300.

As shown in FIG. 4, there is a need to necessarily have the four conductor bars 1411 to 1414 stacked on one another, and first, the equivalent circuit model as shown in FIG. 5 is configured to thus determine the number of conductor bars stacked optimally.

Hereinafter, an explanation of an RF chip package according to a second embodiment of the present invention will be given with reference to FIGS. 1 to 5, but different aspects from the RF chip package according to the first embodiment of the present invention will be discussed below.

Unlike the RF chip package according to the first embodiment of the present invention, the RF chip package according to the second embodiment of the present invention includes only the first mutual inductance controller 1410, without any adoption of the second mutual inductance controller 1420, and the specific configuration of the first mutual inductance controller 1410 is the same as that of the RF chip package according to the first embodiment of the present invention.

Hereinafter, an explanation of an RF chip package according to a third embodiment of the present invention will be given with reference to FIGS. 1 to 5, but different aspects from the RF chip package according to the first embodiment of the present invention will be discussed below.

Unlike the RF chip package according to the first embodiment of the present invention, the RF chip package according to the third embodiment of the present invention includes only the second mutual inductance controller 1420, without any adoption of the first mutual inductance controller 1410, and the specific configuration of the second mutual inductance controller 1420 is the same as that of the RF chip package according to the first embodiment of the present invention.

Figure 6:
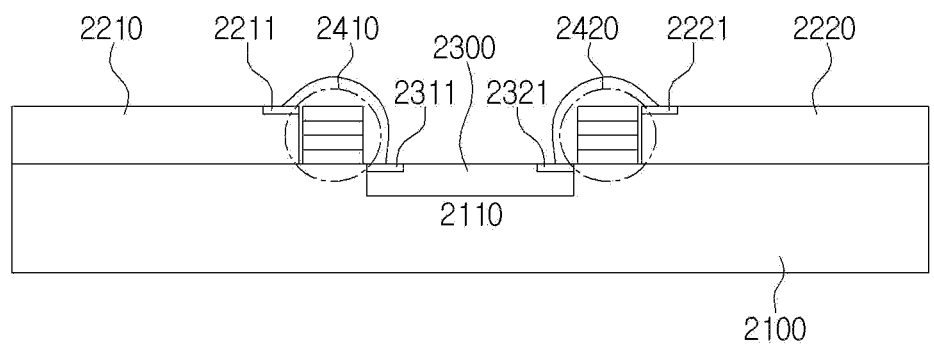
FIG. 6 is a sectional view showing an RF chip package according to a fourth embodiment of the present invention.
Figure 7:
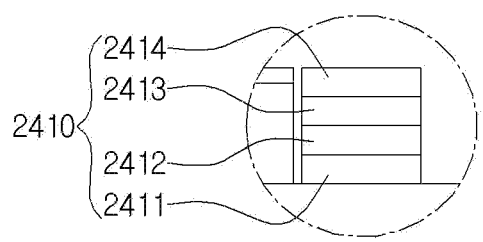
FIG. 7 is an enlarged sectional view showing a first mutual inductance controller of FIG. 6.
Figure 8:
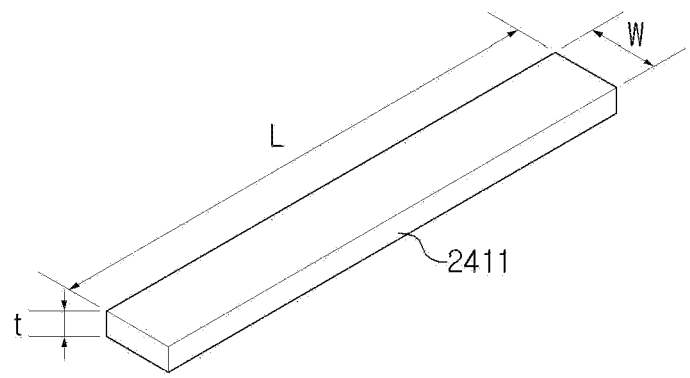
FIG. 8 is a perspective view showing a conductor bar constituting the first mutual inductance controller of FIG. 6.

FIG. 6 is a sectional view showing an RF chip package according to a fourth embodiment of the present invention, FIG. 7 is an enlarged sectional view showing a first mutual inductance controller of FIG. 6, and FIG. 8 is a perspective view showing a conductor bar constituting the first mutual inductance controller of FIG. 6.

Now, an explanation of an RF chip package according to a fourth embodiment of the present invention will be given with reference to FIGS. 6 to 8.

The RF chip package according to the fourth embodiment of the present invention includes a substrate 1100 constituted of a silicon substrate or copper substrate, and as shown in FIG. 6, a portion of the substrate 1100 is provided with a  -shaped cavity 2110 by means of etching or grinding. An RF die 2300 is mounted on top of the cavity 2110 of the substrate 2100, and a first peripheral circuit chip 2210 and a second peripheral circuit chip 2220 are mounted on top of the substrate 2100 where the casing 2110 is not formed.

As shown in FIGS. 6 and 7, further, a first mutual inductance controller 2410 is spaced apart from the first peripheral circuit chip 2210 and the RF die 2300, respectively, on top of the substrate 2100 between the first peripheral circuit chip 2210 and the RF die 2300 to thus control the dimension of the mutual inductance between the first peripheral circuit chip 2210 and the RF die 1300.

As shown in FIGS. 6 and 7, further, a second mutual inductance controller 2420 is spaced apart from the second peripheral circuit chip 2220 and the RF die 2300, respectively, on top of the substrate 2100 between the second peripheral circuit chip 2220 and the RF die 2300 to thus control the dimension of the mutual inductance between the second peripheral circuit chip 2220 and the RF die 2300.

Further, as shown in FIG. 8, the first mutual inductance controller 2410 or the second mutual inductance controller 2420 is constituted of a conductor bar 2411 having the shape of a rectangular parallelepiped and made of any one material selected from Cu, Al, Au, and Ag.

In this case, the first mutual inductance controller 2410 or the second mutual inductance controller 2420 is configured to allow the dimension of the conductor bar 2411 to be adjusted to thus control the dimension of the mutual inductance between the first peripheral circuit chip 2210 and the RF die 2300 or between the second peripheral circuit chip 2220 and the RF die 2300.

In detail, as shown in FIG. 8, any one of sizes t, W, and L of the conductor bar 2411 is changed so that the dimension of the conductor bar 2411 can be adjusted.

Further, as shown in FIG. 7, the first mutual inductance controller 2410 or the second mutual inductance controller 2420 is configured to have a plurality of conductor bars 2411 to 2414 with the same size as one another stacked on one another to thus control the dimension of the mutual inductance between the first peripheral circuit chip 2210 and the RF die 2300 or between the second peripheral circuit chip 2220 and the RF die 2300.

As shown in FIG. 8, there is a need to necessarily have the four conductor bars 2411 to 2414 stacked on one another, and first, the equivalent circuit model as shown in FIG. 5 is configured to thus determine the number of conductor bars stacked optimally.

Hereinafter, an explanation of an RF chip package according to a fifth embodiment of the present invention will be given with reference to FIGS. 6 to 8, but different aspects from the RF chip package according to the fourth embodiment of the present invention will be discussed below.

Unlike the RF chip package according to the fourth embodiment of the present invention, the RF chip package according to the fifth embodiment of the present invention includes only the first mutual inductance controller 2410, without any adoption of the second mutual inductance controller 2420, and the specific configuration of the first mutual inductance controller 2410 is the same as that of the RF chip package according to the fourth embodiment of the present invention.

Hereinafter, an explanation of an RF chip package according to a sixth embodiment of the present invention will be given with reference to FIGS. 6 to 8, but different aspects from the RF chip package according to the fourth embodiment of the present invention will be discussed below.

Unlike the RF chip package according to the fourth embodiment of the present invention, the RF chip package according to the sixth embodiment of the present invention includes only the second mutual inductance controller 2420, without any adoption of the first mutual inductance controller 2410, and the specific configuration of the second mutual inductance controller 2420 is the same as that of the RF chip package according to the fourth embodiment of the present invention.

As described above, the RF chip package according to the present invention is configured to mount the mutual inductance controller thereon to control the mutual inductance generated between the peripheral circuit chip and the RF die, so that adverse reactions can be effectively suppressed from occurring due to the parasitic inductances present among the peripheral circuit chips, the bonding wires, and the RF die.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above teachings. It is therefore intended that the scope of the invention be limited not by this detailed description, but rather by the claims appended hereto.

What is claimed is:

1. A radio frequency (RF) chip package comprising:
   an RF die;
   a first peripheral circuit chip electrically connected to pads of the RF die by means of wire bonding, having matching circuits or passive elements, and located on a left side of the RF die;
   a second peripheral circuit chip electrically connected to pads of the RF die by means of wire bonding, having matching circuits or passive elements, and located on a right side of the RF die;
   a substrate for mounting the RF die, the first peripheral circuit chip, and the second peripheral circuit chip thereon and having a ⌐⌐-shaped step formed on a portion thereof so that the RF die is mounted on top of a step of the substrate and the first peripheral circuit chip and the second peripheral circuit chip are mounted on top of the substrate where no step is formed;
   a first mutual inductance controller spaced apart from the first peripheral circuit chip and the RF die, respectively, on top of the substrate between the first peripheral circuit chip and the RF die, to thus control a dimension of a mutual inductance between the first peripheral circuit chip and the RF die; and
   a second mutual inductance controller spaced apart from the second peripheral circuit chip and the RF die, respectively, on top of the substrate between the second peripheral circuit chip and the RF die, to thus control a dimension of a mutual inductance between the second peripheral circuit chip and the RF die.

2. The RF chip package according to claim 1, wherein the first mutual inductance controller or the second mutual inductance controller is constituted of a conductor bar having a shape of a rectangular parallelepiped and made of any one material selected from Cu, Al, Au, and Ag.

3. The RF chip package according to claim 2, wherein the first mutual inductance controller or the second mutual inductance controller is configured to allow a dimension of the conductor bar to be adjusted to control the dimension of the mutual inductance between the first peripheral circuit chip and the RF die or between the second peripheral circuit chip and the RF die.

4. The RF chip package according to claim 2, wherein the first mutual inductance controller or the second mutual inductance controller is configured to have a plurality of conductor bars with the same size as one another to thus control the dimension of the mutual inductance between the first peripheral circuit chip and the RF die or between the second peripheral circuit chip and the RF die.

5. A radio frequency (RF) chip package comprising:
   an RF die;
   a first peripheral circuit chip electrically connected to pads of the RF die by means of wire bonding, having matching circuits or passive elements, and located on a left side of the RF die;
   a second peripheral circuit chip electrically connected to pads of the RF die by means of wire bonding, having matching circuits or passive elements, and located on a right side of the RF die;
   a substrate for mounting the RF die, the first peripheral circuit chip, and the second peripheral circuit chip thereon and having a ⌐⌐-shaped step formed on a portion thereof so that the RF die is mounted on top of a step of the substrate and the first peripheral circuit chip and the second peripheral circuit chip are mounted on top of the substrate where no step is formed; and
   a first mutual inductance controller spaced apart from the first peripheral circuit chip and the RF die, respectively, on top of the substrate between the first peripheral circuit chip and the RF die, to thus control a dimension of a mutual inductance between the first peripheral circuit chip and the RF die.

6. The RF chip package according to claim 5, wherein the first mutual inductance controller is constituted of a conductor bar having a shape of a rectangular parallelepiped and made of any one material selected from Cu, Al, Au, and Ag.

7. The RF chip package according to claim 6, wherein the first mutual inductance controller is configured to allow a dimension of the conductor bar to be adjusted to control the dimension of the mutual inductance between the first peripheral circuit chip and the RF die.

8. The RF chip package according to claim 6, wherein the first mutual inductance controller is configured to have a plurality of conductor bars with the same size as one another to thus control the dimension of the mutual inductance between the first peripheral circuit chip and the RF die.

9. A radio frequency (RF) chip package comprising:
  an RF die;
  a first peripheral circuit chip electrically connected to pads of the RF die by means of wire bonding, having matching circuits or passive elements, and located on a left side of the RF die;
  a second peripheral circuit chip electrically connected to pads of the RF die by means of wire bonding, having matching circuits or passive elements, and located on a right side of the RF die;
  a substrate for mounting the RF die, the first peripheral circuit chip, and the second peripheral circuit chip thereon and having a ⊓ -shaped step formed on a portion thereof so that the RF die is mounted on top of a step of the substrate and the first peripheral circuit chip and the second peripheral circuit chip are mounted on top of the substrate where no step is formed; and
  a mutual inductance controller spaced apart from the second peripheral circuit chip and the RF die, respectively, on top of the substrate between the second peripheral circuit chip and the RF die, to thus control a dimension of a mutual inductance between the second peripheral circuit chip and the RF die.

10. The RF chip package according to claim 9, wherein the second mutual inductance controller is constituted of a conductor bar having a shape of a rectangular parallelepiped and made of any one material selected from Cu, Al, Au, and Ag.

11. The RF chip package according to claim 10, wherein the second mutual inductance controller is configured to allow a dimension of the conductor bar to be adjusted to control the dimension of the mutual inductance between the second peripheral circuit chip and the RF die.

12. The RF chip package according to claim 10, wherein the second mutual inductance controller is configured to have a plurality of conductor bars with the same size as one another to thus control the dimension of the mutual inductance between the second peripheral circuit chip and the RF die.

* * * * *